United States Patent [19]

Haussmann

[11] Patent Number: 4,737,729
[45] Date of Patent: Apr. 12, 1988

[54] METHOD AND CIRCUIT FOR THE DEMODULATION OF TIME DISCRETE, FREQUENCY MODULATED SIGNALS

[75] Inventor: Wolfgang Haussmann, Munich, Fed. Rep. of Germany

[73] Assignee: Siemens Aktiengesellschaft, Berlin and Munich, Fed. Rep. of Germany

[21] Appl. No.: 30,300

[22] Filed: Mar. 23, 1987

Related U.S. Application Data

[63] Continuation-in-part of Ser. No. 715,518, Mar. 25, 1985, abandoned, which is a continuation of Ser. No. 627,495, Jul. 6, 1984, abandoned, which is a continuation of Ser. No. 290,330, Aug. 5, 1981, abandoned.

[30] Foreign Application Priority Data

Aug. 14, 1980 [DE] Fed. Rep. of Germany ....... 3030853

[51] Int. Cl.[4] .............................................. H03D 1/00
[52] U.S. Cl. ..................................... 329/145; 307/529
[58] Field of Search ............... 307/261, 358, 510, 518, 307/529; 329/137, 145; 455/214, 337

[56] References Cited

U.S. PATENT DOCUMENTS 4,035,735 7/1977 Akashi et al. ...................... 329/145
4,054,841 10/1977 Henaff et al. ...................... 329/145

Primary Examiner—John Zazworsky
Attorney, Agent, or Firm—Herbert L. Lerner; Laurence A. Greenberg

[57] ABSTRACT

A method for demodulation of a time discrete, sampled, frequency modulated digitized signal arriving as samples, each having a digital value, at a constant rate of repetition of one clock period TA per sample, including delay lines through which the signal to be demodulated are conducted, the method which includes taking three consecutive digital samples of the signal, the first sample at the initial time T and the second sample after two clock periods and a third sample taken after one clock period respectively, adding the digital value of the first and second sample forming their sum, dividing the sum by the digital value of the third sample, forming a division, the division forming a digital sample which represents a sample of the demodulated signal.

9 Claims, 1 Drawing Sheet

METHOD AND CIRCUIT FOR THE DEMODULATION OF TIME DISCRETE, FREQUENCY MODULATED SIGNALS

BACKGROUND OF THE INVENTION

This is a continuation-in-part of application Ser. No. 715,518, filed Mar. 25, 1985, now abandoned, which was a continuation of application Ser. No. 627,495, filed July 6, 1984, now abandoned; which was a continuation of application Ser. No. 290,330, filed Aug. 5, 1981, now abandoned.

The invention relates to a method and a circuit for the demodulation of time-discrete, sampled, digitized frequency-modulated signals in which the signal to be demodulated is led through delay lines.

Digital signal processing makes it possible to digitally approach numerous signal processing problems which were so far solved by analog techniques. There are, however, various exceptions. For instance, no digital component capable of performing an FM demodulation function at justifiable expense and in real time has been described to date which would correspond to demodulators for FM signals as used in analog technology. Several possibilities similar to digital methods have proved unsuitable in practice. Zero-crossing detectors, for example, are poorly suited because it is precisely the zero crossings which are lost due to the necessarily performed sampling process. It is therefore desirable to perform processing of the sampled values with the functions of an FM demodulator, suppressing or limiting the effects of amplitude modulation.

In detail, various possibilities for the demodulation of time-discrete, frequency-modulated signals have so far been considered:

The use of a digital phase-locked control loop (see Kelly, Gupta: "The Digital PLL (Phase-Locked Loop) as a Near-Optimum FM Demodulator", IEEE Transaction on Communications, June 1972) and the method of a slaved, adaptive filter (see Griffith's: "Rapid Measurement of Digital Instantaneous Frequency", IEEE Transactions of Acoustics, Speech and Signal Processing, April 1975) leads to control circuits with the associated problems such as transient behavior and stability, etc.

The fast Fourier transform, also considered heretofore, (see Roth: "Effective Measurements Using Digital Signal Analysis", IEEE Spectrum, April 1971) requires comparatively sophisticated computation for demodulation so that real time processing remains largely restricted to the area of low carrier frequencies.

Accordingly, all methods discussed to date require great expense for system development and for the production of the component.

Thought could further be given to first digitally converting the frequency modulation into amplitude modulation and only then to demodulating the amplitude modulation. There are various possibilities for converting a frequency modulation into an amplitude modulation. However, problems associated with digital amplitude demodulation and digital limiting have so far not been solved.

It is accordingly an object of the invention to provide a method and circuit for the demodulation of a frequency modulated signal that is available in the form of time-discrete samples of frequency-modulated signals in the form of sampled values, which overcomes the hereinbefore-mentioned disadvantages of the heretofore-known methods and devices of this general type.

With the foregoing and other objects in view there is provided, in accordance with the invention, a method for the demodulation of sampled, frequency-modulated signals that combines and processes three (consecutive) samples of the signal, such that the output of the process is a signal that is directly proportional with the instantaneous frequency contained in the aforesaid three samples, and further includes delay lines to which the signal to be demodulated is connected. The signal comprising aforesaid three scanning samples of the signal to be demodulated are combined and processed in such a way that an output signal, that is directly proportional to the instantaneous frequency of the signal containing the three samples, is produced.

In accordance with another mode of the invention, there is provided a method which comprises summing the signal samples obtained first at an initial time T and next at the output of a delay line at time $T+2\ T_A$, wherein $T_A$ is the sampling time and dividing the sum by a value proportional to the signal sample value at time $T+T_A$.

In accordance with a further mode of the invention, there is provided a method with comprises summing the scanning samples taken first at an initial time T and next at the output of two delay lines at time $T+2\ T_A$, dividing the sum by twice the value of the scanning sample after one delay line at time $T+T_A$, and determining an inverted cosine (arc-cosine) function from the result of the division. This computation yields a value that is numerically directly proportional to the instantaneous frequency of the signal contarning the three signal samples. In circuits operating with discrete amplitudes, such as in digital circuits, the division and the formation of the inverse cosine (arc-cosine) function can be performed by a computer at low sampling frequencies. At higher sampling frequencies the computer is replaced by a read only memory in which is stored the pre-computed values of the aforesaid computation.

In the method according to the invention, the demodulation result is independent of the amplitude of the scanned signal. Therefore, a limiting process is simultaneously also attained. In addition, the result is also independent of the phase of the scanning clock.

In accordance with the invention, there is provided a circuit for carrying out aforesaid method for demodulation of time-discrete, sampled frequency-modulated signals, comprising a first delay line connected with its input side to the signal, and to one input of a summing stage having its other input connected to the output side of a second delay line connected between the first delay line and the summing stage, a read-only memory (ROM) being connected to a junction point between the first and second delay lines and being connected to the output of the summing stage, and an output of the read-only memory supplying the demodulated signal.

Other features which are considered as characteristic for the invention are set forth in the appended claims.

Although the invention is illustrated and described herein as embodied in a method and circuit for the demodulation of sampled time-discrete, frequency-modulated signals, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

Figure 1:
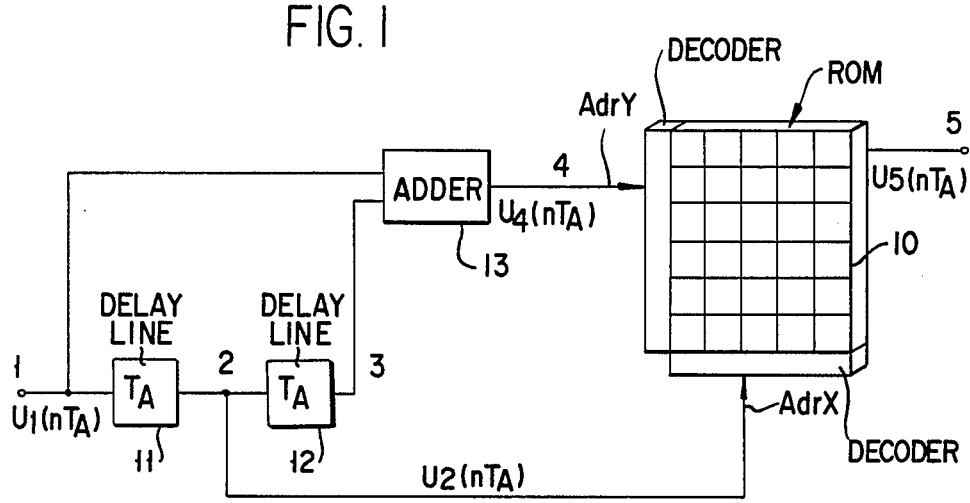
FIG. 1 is a diagrammatic and schematic circuit diagram of an embodiment example of the circuit according to the invention using a read only memory.

Referring now to the figures of the drawing and first particularly to FIG. 1 thereof, there is seen an embodiment example of the circuit according to the invention with a ROM 10. The ROM 10 has an x-axis and a y-axis and is programmed so that it contains a translation table for the function:

$$U_5 = \text{arc cos} \,((U(T) + U(T+2TA))/2U(T+TA))$$

wherein TA is the clock period and wherein the y-axis represents all applicable values of the numerator and the x-axis represents all applicable values of the denominator, and wherein the memory cell defined by the intersection of the x-axis and the y-axis contains the computed function for $U_5$. An input terminal 1 carries the digital, sampled FM signal $U_1(nT_A)$ to be demodulated to the form of a sequence of digital amplitude samples. In FIG. 1 the input 1 is followed by a first delay line 11, which delays the input signal by one clock period $T_A$. Thus, the input signal that is delayed by one clock period $T_A$ is obtained at a junction point 2. The junction point 2 is succeeded by a second delay line 12 in which a signal from the junction point 2 is likewise delayed by one clock period $T_A$. Therefore the input signal delayed by two clock periods $T_A$ can be taken off at the output 3 of the delay line 12. An adder or summing stage 13 having an output 4 which is connected to the read-only memory 10 at input $Adr_y$, is connected to the output 3 of delay line 12 and the input 1. Furthermore, the connecting point 2 is connected directly to the read-only memory 10 at input $Adr_x$. Thus, the output 4 of the adder 13 carries the sum of the undelayed input signal U1(nTA) and of the input signal delayed by two clock periods $T_A$, U1(nTA+2TA) to point $Adr_y$. The signals at the output 4 and at the junction point 2 thus directly control the address inputs of the read-only memory 10 in which is stored the already performed results of the division and the formation of the inverted cosine (arc-cosine) function as described hereinabove. Accordingly, a value proportional to the frequency on which the samples applied to points 1, 2, and 3 are based, is stored in selected locations defined by the conjunctions of the corresponding x and y addresses of the read-only memory 10. Thus, the demodulated signal $U_5$ ($nT_A$) in the form of a sequence of samples is obtained at the output 5 of the read-only memory 10.

If the FM demodulator is viewed as a filter, the following equation results:

$$U_5(nT_A) = C \times \text{arc-cosine} \,((U_4(nT_A))/(2U_2(nT_A)))$$

with the Z-transformations:

$$U_4(z) = U_1(z) \times (1+z^{-2}) \text{ and } U_2(z) = U_1(z) \times z^{-1}$$

C being a normalizing constant to be determined.

Figure 2:
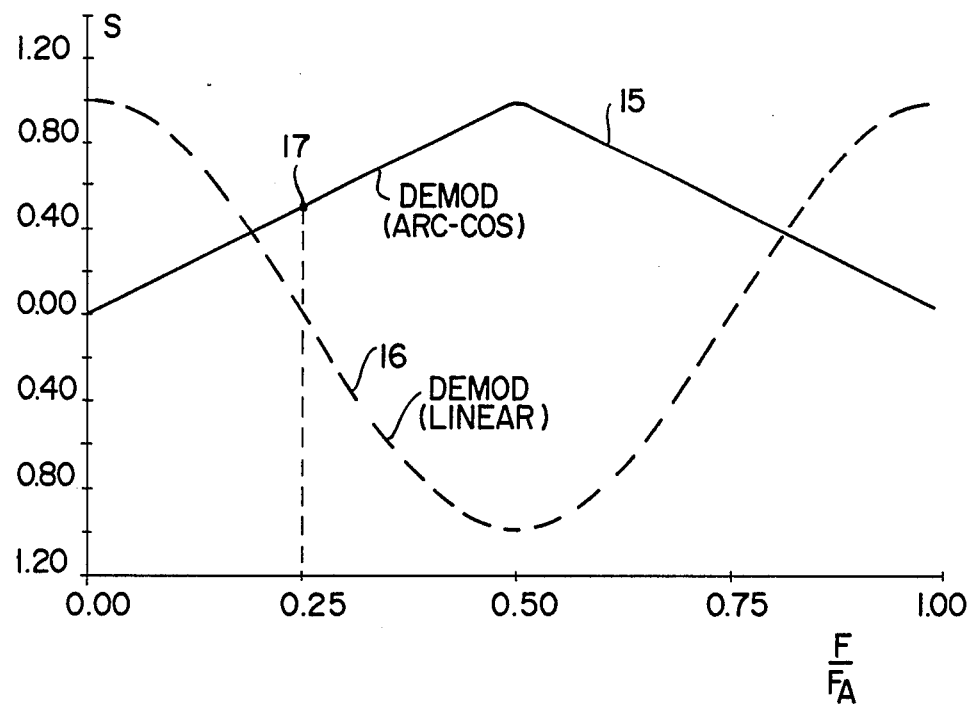
FIG. 2 is a graphical representation of the demodulation characteristic of the demodulator operating according to the invention.

FIG. 2 shows the demodulation characteristic of the demodulator constructed according to the invention, each axis being suitably normalized. The instantaneous frequency F of the FM signal to be demodulated is plotted on the X-axis relative to the clock frequency $F_A = 1/TA$. The demodulated signal S is indicated on the Y-axis.

As may be seen from FIG. 2, the demodulation characteristic 15 is shown in full lines as two sloping straight lines. If, for example, the input signal $U_1(nT_A)$ oscillates about the normalized frequency F/FA=0.25, as indicated by the point 17, a perfect linear demodulation is attained. Also shown is the demodulation characteristic 16 of an FM demodulator, obtained when the inverted cosine (arc-cosine) function is not formed, in other words, if the ROM 10 contains is these memory cells the already computed results of the division:

$$U_5 = (U(T) + U((T+2TA))/2U(T+TA)$$

in which no conversion to arc cosine has been performed. In this case the demodulation is not perfectly linear, but is a cosine function. This characteristic 16 represents a cosine function, and it is evident that for FM signals in the F/FA range of 0.25 times and 0.75 times the sampling frequency the formation of the inverted cosine function is unnecessary because, in these ranges the ensuing demodulation characteristic 16 contains only insignificant nonlinearities in fairly wide range.

I claim:

1. Method for demodulation of a time discrete frequency modulated digitized signal arriving as digital samples at a constant repetition rate of a clock period TA between consecutive samples, including delay lines through which the signal to be demodulated is conducted, the method which comprises:
   taking a first sample at the initial time T and a second sample after two clock periods and a third sample after one clock period respectively,
   adding the digital value of said first and second sample forming their sum,
   dividing said sum by the digital value of said third sample forming a division, said division being proportional to a sample of the demodulated signal.

2. Method according to claim 1 which comprises dividing said sum of said first and second samples by twice the value of said third sample, and forming the arc-cosine of said division.

3. Circuit for demodulation of a time discrete frequency modulated, digitized signal arriving at the circuit as digital samples at a constant repetition rate of one clock period TA between consecutive samples, the circuit which comprises:
   a circuit input for receiving the frequency modulated signal as successive first second and third samples;
   a first delay line having a delay of one clock period for receiving the first one of said digital samples and forming the third digital sample that is delayed one clock period from the first sample,
   a second delay line having a delay of one clock period TA for receiving said third digital sample and forming the second digital sample that is delayed two clock periods from said first sample,
   a summing circuit having a first and a second summing input and an output, said first and second summing inputs for receiving respectively said first and second digital samples and forming at its output the digital value of the sum of the digital values of said first and second samples, a dividing circuit having a divisor input, a dividend input and a division output, said dividend input for receiving said digital value of said sum, said divisor input for receiving said third digital sample, the division output forming a digital sample of the demodulated signal.

4. Circuit for demodulation of a frequency modulated signal according to claim 3 wherein said dividing circuit further comprises a read only memory having Y addresses and X addresses having respective Y and X address inputs for respectively receiving a Y-address signal forming said dividend input and an X-address signal forming said divisor input, a plurality of memory conjunctions each having a content being equal to the Y-address signal divided by the X-address signal and being addressable by said Y-address and said X-address, said plurality equal to the number of Y-addresses multiplied by the number of X-addresses and an output being equal to the content of the conjunction addressed by said X-address and said Y-address input signals, the content thereof being equal to a sample of the demodulated signal.

5. Circuit according to claim 4 wherein said content of each of said conjunctions is equal to the arc-cosine of the Y-address divided by two times the X-address.

6. A method of demodulating a frequency modulated signal consisting of discrete sequential digital samples each representing an instantaneous frequency F in time of the signal, the samples being separated by a constant time increment $T_A$, comprising passing the samples through at least two delay lines, each having a delay time equal to $T_A$, taking a first sample at a time equal to $nT_A$, wherein n is a given integer; taking a second sample at the time equal to $nT_A = 2TA$; taking a third sample at a time equal to $nT_A + T_A$; forming a sum of the first and second sample; dividing the sum by two times the third sample; forming the demodulated signal as the arc cos function of the division.

7. A method as claimed in claim 6 wherein for the case of a ratio of the instantaneous frequency of the signal to be demodulated and the sampling frequency being equal to 0.25 or 0.75, including adding the digital samples at points of time T and $T+2T_A$, and dividing the sum by a number which is proportional to the digital sample at the point of time $T+T_A$.

8. A method as claimed in claim 6, using at least a first and a second delay line each having an input and an output, an adder having first and second inputs and a sum output, a read-only memory having a plurality of Y and X addresses divided into a respective Y and X address group, and Y times X addressable memory conjunctions, each memory conjunction containing the division of the Y-address by the X-address, the signal to be demodulated being connected to the input of the first delay line and to the first input of the adder; comprising connecting the output of the first delay line to the input of the second delay line and to the X-address group; addressing the conjunction containing the division respectively being addressed, and reading the demodulated signal as the division from the output of the read-only memory.

9. A method as claimed in claim 6, using at least a first and a second delay line each having an input, an output, a junction point between the two delay lines, an adder having first and second inputs and a sum output, a computing unit having first and second inputs and an output, for computing the division of the sum output by the first delay line output, and for computing the arc cos of the division; comprising connecting the junction point to the first input of the computing unit, connecting the output of the adder to the second input of the computing unit; and reading the demodulated signal as the arc cos function at the output of the computing unit.

* * * * *